(12) United States Patent
May

(10) Patent No.: US 6,906,591 B2
(45) Date of Patent: Jun. 14, 2005

(54) AMPLIFIER HAVING MOS CAPACITOR COMPENSATION

(75) Inventor: Michael R. May, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 33 days.

(21) Appl. No.: 10/723,492

(22) Filed: Nov. 26, 2003

(65) Prior Publication Data

US 2004/0108899 A1 Jun. 10, 2004

Related U.S. Application Data

(60) Provisional application No. 60/429,941, filed on Nov. 29, 2002.

(51) Int. Cl.$^7$ ................................................. H03F 3/16
(52) U.S. Cl. ........................ 330/277; 330/302; 330/311
(58) Field of Search ................................ 330/277, 302, 330/311

(56) References Cited

U.S. PATENT DOCUMENTS

| | | | | |
|---|---|---|---|---|
| 5,027,082 A | * | 6/1991 | Wisherd et al. | ............. 330/277 |
| 5,477,186 A | * | 12/1995 | Kobatake | ..................... 330/9 |
| 6,100,742 A | * | 8/2000 | Erckert | ........................ 327/374 |
| RE36,932 E | * | 10/2000 | Furutani | ..................... 365/226 |

* cited by examiner

Primary Examiner—Patricia Nguyen
(74) Attorney, Agent, or Firm—Garlick, Harrison & Marrison LLP; Timothy W. Markison

(57) ABSTRACT

An amplifier includes a transistor, a current source, a MOS capacitor, and a level shifting module. The transistor includes a gate, a drain, and a source, wherein the source of the transistor is operably coupled to a voltage node. The current source is operably coupled to provide a current to the drain of the transistor. The Metal Oxide Semiconductor (MOS) capacitor includes a gate, a drain, a source, and a well, wherein the drain, the well, and the source of the MOS capacitor are coupled together to form a first plate of the MOS capacitor and the gate of the MOS capacitor provides a second plate of the MOS capacitor, wherein the second plate of the MOS capacitor is operably coupled to the gate of the transistor, wherein the drain of the transistor provides an output for the amplifier and the gate of the transistor provides an input of the amplifier. The level shifting module is operably coupled to the first plate of the MOS capacitor such that the level shifting module shifts a gate-source voltage of the MOS capacitor to reduce variances of capacitance of the MOS capacitor such that bandwidth of the amplifier is limited and the amplifier is stable.

8 Claims, 3 Drawing Sheets

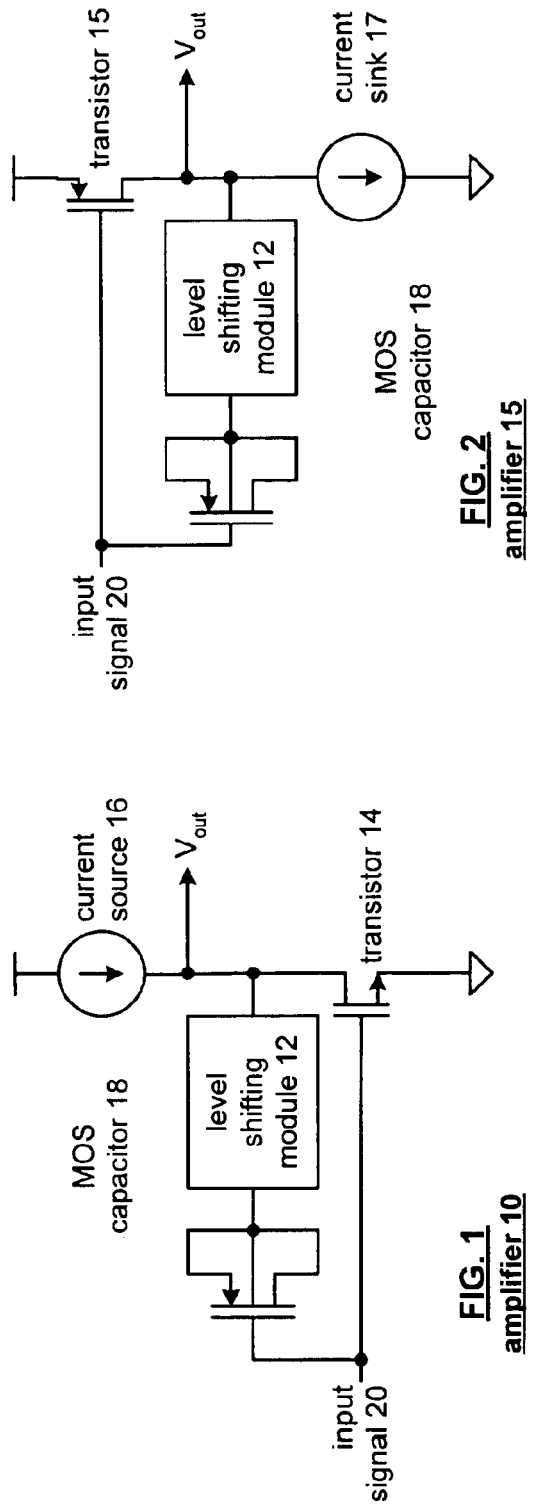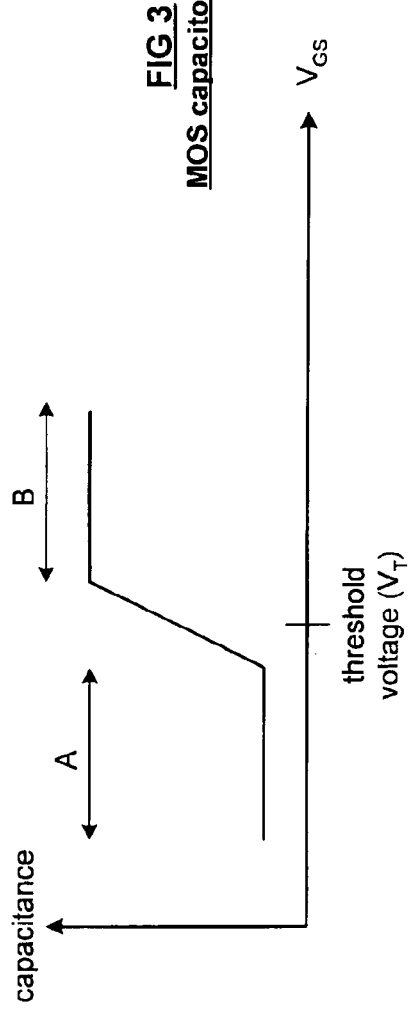

shift MOS cap to region B shift MOS cap to region A operational amplifier 30

US 6,906,591 B2

AMPLIFIER HAVING MOS CAPACITOR COMPENSATION

CROSS REFERENCE TO RELATED PATENTS

This patent application is claiming priority under 35 USC § 119 to provisionally filed patent application entitled MULTI-FUNCTION HANDHELD DEVICE, having a provisional Ser. No. of 60/429,941, and a filing date of Nov. 29, 2002.

BACKGROUND OF THE INVENTION

1. Technical Field

This invention relates generally to integrated circuits and more particularly to drivers used in such integrated circuits.

2. Description of Related Art

As is known, an operational amplifier includes compensation to limit its bandwidth such that the operational amplifier is stable. Typically, the compensation is achieved by including a high precision capacitor. A high precision capacitor is required to ensure that its capacitance value does not vary significantly, which, if it did vary significantly, would cause the bandwidth of the operational amplifier to vary and potentially cause the operational amplifier to be unstable. As is further known, to achieve a high precision capacitor in a Complimentary Metal Oxide Semiconductor (CMOS) integrated circuit fabrication process, a metal capacitor is used. Such metal capacitors while providing accurate capacitance values consume relatively large amount of die area in comparison to the rest of the operational amplifier.

As is also known, in a CMOS integrated circuit fabrication process, a Metal Oxide Semiconductor Field Effect Transistor (MOSFET) having its drain coupled to its source forms a small die area per capacitance value capacitor, which is typically called a MOS capacitor. However, as the gate voltage varies relative to the source/drain, the capacitance of a MOS capacitor varies substantially (e.g., by approximately 20%). Such a variation in capacitance is unacceptable for use to compensate an operational amplifier since the variation would cause the bandwidth of the amplifier to vary significantly. In particular, if the bandwidth gets too large when the capacitance is at a minimum, the operational amplifier can be unstable and cause performance degradation in the circuit.

Therefore, a need exists for an operational amplifier that utilizes the high capacitance density of a MOSFET while managing the capacitance variation of the MOSFET to maintain stability of the amplifier.

BRIEF SUMMARY OF THE INVENTION

The amplifier having MOS capacitor compensation of the present invention substantially meets these needs and others. In one embodiment, an amplifier includes a transistor, a current source, a MOS capacitor, and a level shifting module. The transistor includes a gate, a drain, and a source, wherein the source of the transistor is operably coupled to a voltage node. The current source is operably coupled to provide a current to the drain of the transistor. The Metal Oxide Semiconductor (MOS) capacitor includes a gate, a drain, a source, and a well, wherein the drain, the well, and the source of the MOS capacitor are coupled together to form a first plate of the MOS capacitor and the gate of the MOS capacitor provides a second plate of the MOS capacitor, wherein the second plate of the MOS capacitor is operably coupled to the gate of the transistor, wherein the drain of the transistor provides an output for the amplifier and the gate of the transistor provides an input of the amplifier. The level shifting module is operably coupled to the first plate of the MOS capacitor such that the level shifting module shifts a gate-source voltage of the MOS capacitor to reduce variances of capacitance of the MOS capacitor such that bandwidth of the amplifier is limited and the amplifier is stable.

BRIEF DESCRIPTION OF THE SEVERAL VIEWS OF THE DRAWINGS

FIG. 1 is a schematic block diagram of an amplifier in accordance with an embodiment of the present invention;

FIG. 2 is a schematic block diagram of an amplifier in accordance with another embodiment of the present invention;

FIG. 3 is a diagram of a MOS capacitor;

DETAILED DESCRIPTION OF THE INVENTION

Figure 5:
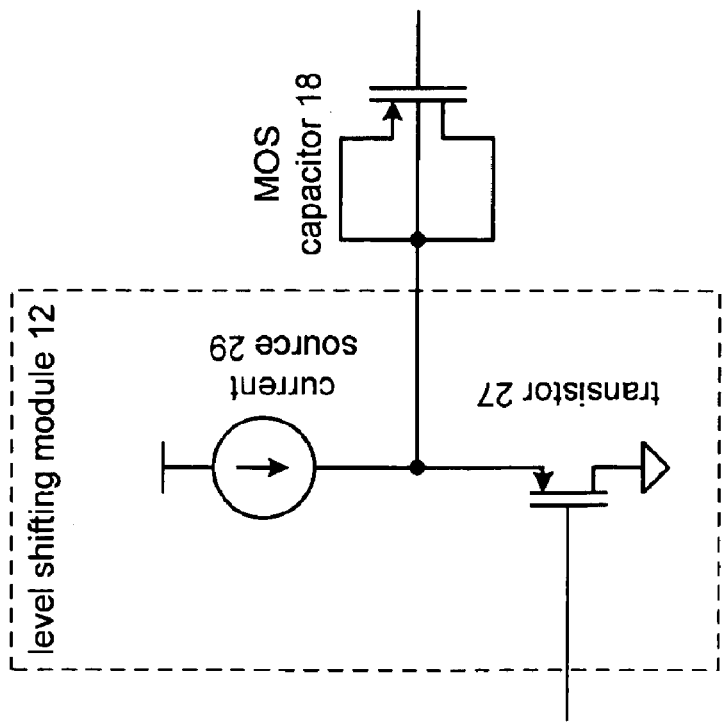
FIG. 5 is a schematic of a level shifting module in accordance with another embodiment of the present invention.

FIG. 1 is a schematic block diagram of an amplifier 10 that includes a level shifting module 12, an N-channel transistor 14, a current source 16, and a MOS capacitor 18. The MOS capacitor 18 includes a gate, a drain, a source, and a well, where the drain, source, and well are coupled together and form one plate of the MOS capacitor. The gate of the MOS capacitor provides the other plate of the capacitor 18.

In operation, the gate of transistor 14 receives an input signal 20 and amplifies the signal to produce an output signal (Vout). The gain at which the transistor 14 amplifies the input signal 20 is dependent on the physical construct of the transistor and the capacitance of the MOS capacitor. As coupled, the MOS capacitor 18, as shifted by the level shifting module 12, provides a pole to the transfer function of the amplifier 10, thereby limiting the bandwidth of the amplifier and ensuring stability of the amplifier 10.

To maintain the capacitance of the MOS capacitor 18 at a substantially constant value (e.g., at a value in the range of a few pico-Farads to a few micro-Farads), the level shifting module 12 adjusts the gate source voltage of the MOS capacitor. For example, as shown in FIG. 3, the capacitance of a MOS capacitor is relatively linear at gate-source ($V_{GS}$) voltages well below the threshold voltage ($V_T$) and well above the threshold voltage. Accordingly, depending on whether a smaller or larger capacitance value is needed, the level shifting module 12 will adjust the gate-source voltage of the MOS capacitor 18 to region A (for smaller capacitance values) or to region B (for larger capacitance values). An embodiment of the level shifting module 12 to place the MOS capacitor in region A will be discussed in greater detail with reference to FIG. 4 and an embodiment of the level shifting module 12 to place the MOS capacitor in region B will be discussed in greater detail with reference to FIG. 5.

FIG. 2 is a schematic of another amplifier 15 that includes P-channel transistor 15, current sink 17, the MOS capacitor 18, and the level shifting module 12. In this embodiment, the P-channel transistor 15 amplifies the input signal 20 to produce an output ($V_{OUT}$). The MOS capacitor 18, as controlled by the level shifting module 12, provides a capacitance across the gate and drain of the transistor 17 to limit the bandwidth of the amplifier 15 such that the amplifier 15 is stable.

Figure 4:
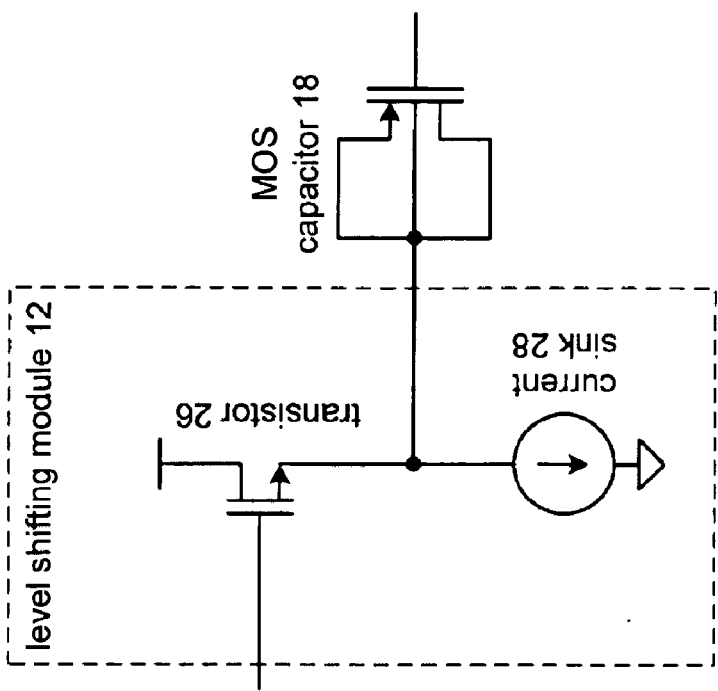
FIG. 4 is a schematic of a level shifting module in accordance with an embodiment of the present invention.

FIG. 4 is a schematic block diagram of an embodiment of the level shifting module 12 to adjust the gate-source voltage of the MOS capacitor 18 into region A of the curve shown in FIG. 3. In this embodiment, the level shifting module 12 includes an N-channel transistor 26 and a current sink 28. The gate of the N-channel transistor 26 receives the signal at the drain of the transistor 14 or 15 such that the source voltage transistor 26 is the gate-source voltage of transistor 14 or 15 of the amplifier less than the voltage on the drain of transistor 14 or 15. The voltage produced at the source of transistor 26 helps control the gate-source voltage of MOS capacitor 18 below the threshold voltage, thus keeping the capacitance of the MOS capacitor in region A.

FIG. 5 is a schematic block diagram of another embodiment of the level shifting module 12 to adjust the gate-source voltage of the MOS capacitor 18 into region B of the curve shown in FIG. 3. In this embodiment, the level shifting module 12 includes a P-channel transistor 27 and a current source 29. The gate of the P-channel transistor 27 receives the signal at the drain of the transistor 14 or 15 such that the source voltage transistor 26 is the gate-source voltage of transistor 14 or 15 of the amplifier greater than the voltage on the drain of transistor 14 or 15. The voltage produced at the source of transistor 27 helps control the gate-source voltage of MOS capacitor 18 above the threshold voltage, thus keeping the capacitance of the MOS capacitor in region B.

Figure 6:
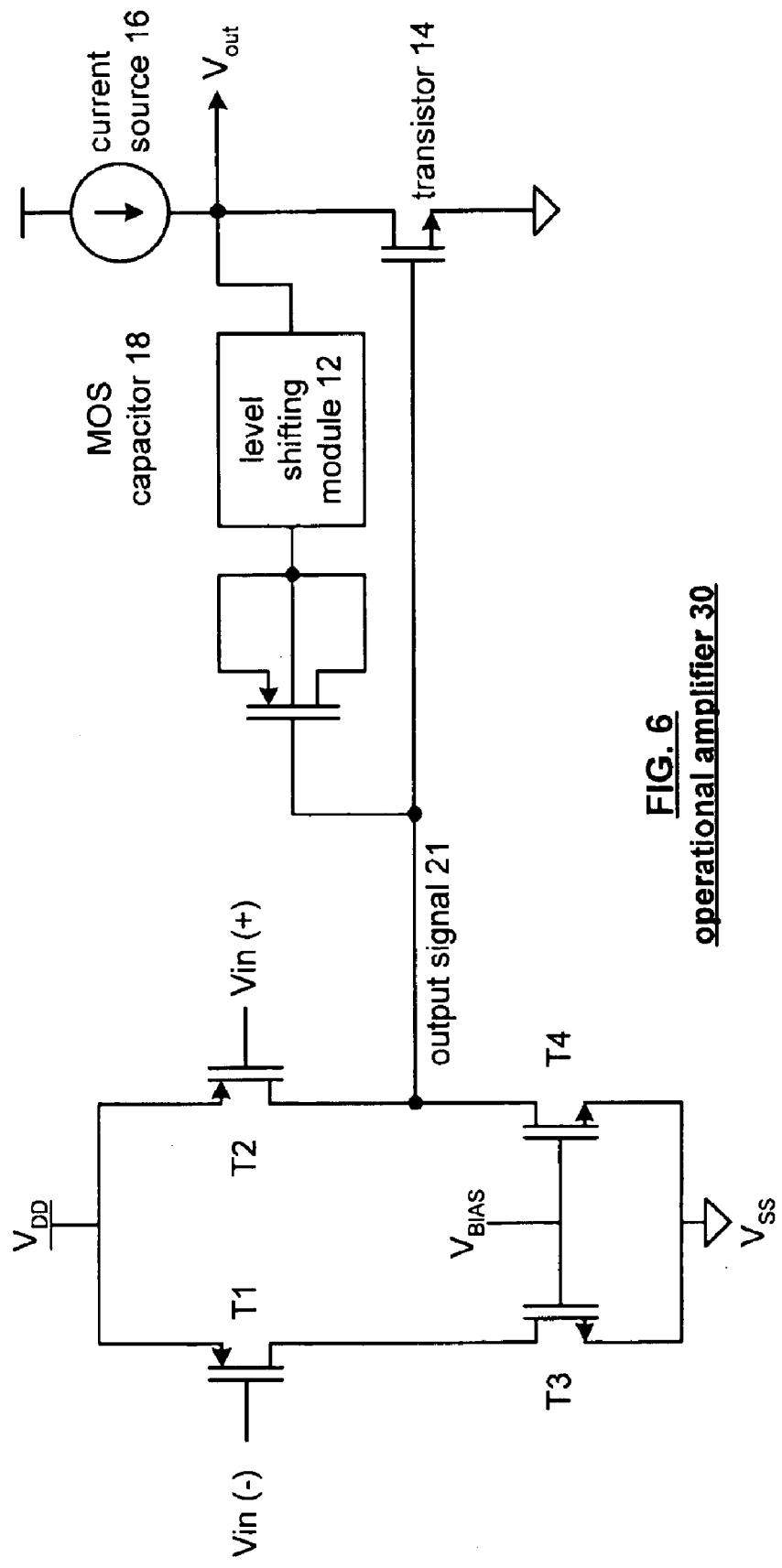
FIG. 6 is a schematic block diagram of an operational amplifier in accordance with an embodiment of the present invention.

FIG. 6 is a schematic block diagram of an operational amplifier 30 that includes an input amplifier stage and an amplifier 10 or 15 (only amplifier 10 is illustrated). The input amplifier stage includes a plurality of transistors T1–T4 operably coupled to receiving a first input signal (Vin(+)) and a second input signal (Vin(−)). From these inputs, the input amplifier stage produces an output signal 21 that is provided to the input of the amplifier 10 or 15. The functionality of amplifier 10 or 15 is as previously discussed.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented an amplifier that utilizes a MOS capacitor to limit the bandwidth of the amplifier such that it is unconditionally stable. As one of average skill in the art will appreciate, other embodiments may be derived from the teachings of the present invention with deviating from the scope of the claims.

What is claimed is:

1. An amplifier comprises:
   a transistor having a gate, a drain, and a source, wherein the source of the transistor is operably coupled to a voltage node;
   a current source operably coupled to provide a current to the drain of the transistor;
   a Metal Oxide Semiconductor (MOS) capacitor having a gate, a drain, a source, and a well, wherein the drain, the well, and the source of the MOS capacitor are coupled together to form a first plate of the MOS capacitor and the gate of the MOS capacitor provides a second plate of the MOS capacitor, wherein the second plate of the MOS capacitor is operably coupled to the gate of the transistor, wherein the drain of the transistor provides an output for the amplifier and the gate of the transistor provides an input of the amplifier; and
   a level shifting module operably coupled to the first plate of the MOS capacitor such that the level shifting module shifts a gate-source voltage of the MOS capacitor to reduce variances of capacitance of the MOS capacitor such that bandwidth of the amplifier is limited and the amplifier is stable.

2. The amplifier of claim 1, wherein the level shifting module comprises:
   a first transistor having a gate, a drain, and a source, wherein the gate of the first transistor is operably coupled to the drain of the transistor and the drain of the first transistor is operably coupled to a supply voltage; and
   a current sink operably coupled to sink current from the source of the first transistor, wherein the source of the first transistor is operably coupled to the drain of the MOS capacitor.

3. The amplifier of claim 1, wherein the level shifting module comprises:
   a first transistor having a gate, a drain, and a source, wherein the gate of the first transistor is operably coupled to the drain of the transistor and the drain of the first transistor is operably coupled to a ground; and
   a current source operably coupled to source current to the source of the first transistor, wherein the source of the first transistor is operably coupled to the drain of the MOS capacitor.

4. The amplifier of claim 1, wherein the voltage node comprises at least one of a supply voltage and a ground.

5. An operational amplifier comprises:
   input stage operably coupled to produce an output signal from a positive input signal and a negative input signal; and
   an amplifier that includes:
      a transistor having a gate, a drain, and a source, wherein the source of the transistor is operably coupled to a voltage node;
      a current source operably coupled to provide a current to the drain of the transistor;
      a Metal Oxide Semiconductor (MOS) capacitor having a gate, a drain, a source, and a well, wherein the drain, the well, and the source of the MOS capacitor are coupled together to form a first plate of the MOS capacitor and the gate of the MOS capacitor provides a second plate of the MOS capacitor, wherein the second plate of the MOS capacitor is operably coupled to the gate of the transistor, wherein the drain of the transistor provides an output for the amplifier and the gate of the transistor provides an input of the amplifier; and a level shifting module operably coupled to the first plate of the MOS capacitor such that the level shifting module shifts a gate-source voltage of the MOS capacitor to reduce variances of capacitance of the MOS capacitor such that bandwidth of the amplifier is limited and the amplifier is stable.

6. The operational amplifier of claim 5, wherein the level shifting module comprises:

a first transistor having a gate, a drain, and a source, wherein the gate of the first transistor is operably coupled to the drain of the transistor and the drain of the first transistor is operably coupled to a supply voltage; and a current sink operably coupled to sink current from the source of the first transistor, wherein the source of the first transistor is operably coupled to the drain of the MOS capacitor.

7. The operational amplifier of claim 5, wherein the level shifting module comprises:

a first transistor having a gate, a drain, and a source, wherein the gate of the first transistor is operably coupled to the drain of the transistor and the drain of the first transistor is operably coupled to a ground; and a current source operably coupled to source current to the source of the first transistor, wherein the source of the first transistor is operably coupled to the drain of the MOS capacitor.

8. The operational amplifier of claim 5, wherein the voltage node comprises at least one of a supply voltage and a ground.

* * * * *